United States Patent [19]
Mukerji et al.

[11] Patent Number: 5,930,652
[45] Date of Patent: Jul. 27, 1999

[54] SEMICONDUCTOR ENCAPSULATION METHOD

[75] Inventors: Prosanto K. Mukerji, Phoenix; Rajesh Srinivasan, Scottsdale, both of Ariz.

[73] Assignee: Motorola, Inc., Schaumburg, Ill.

[21] Appl. No.: 08/654,364

[22] Filed: May 28, 1996

[51] Int. Cl.⁶ .................................................. H01L 21/30
[52] U.S. Cl. ............................ 438/459; 438/455; 438/458
[58] Field of Search ..................................... 438/455–465

[56] References Cited

U.S. PATENT DOCUMENTS

| | | | |
|---|---|---|---|
| 5,061,657 | 10/1991 | Queen et al. | 438/126 |
| 5,300,175 | 4/1994 | Gardner et al. | 438/457 |
| 5,387,551 | 2/1995 | Mizoguchi et al. | 438/455 |
| 5,455,455 | 10/1995 | Badehi . | |
| 5,597,422 | 1/1997 | Kataoka et al. | 438/127 |
| 5,801,084 | 9/1998 | Beasom et al. | 438/455 |

OTHER PUBLICATIONS

ChipScale Staff, "Micro SMT™ Chip Scale Packaging for Integrated Circuits", ChipScale, Inc., 1995, pp. 1–13.
D. Richmond, "Micro SMT Integrated Circuit Technical White Paper", Micro SMT, Inc., Jan. 1993, pp. 1–17.
D. Richmond, "Micro SMT Discrete Device White Paper", Micro SMT, Inc., May 1993, pp. 1–14.

*Primary Examiner*—Kevin M. Picardat
*Attorney, Agent, or Firm*—Robert F. Hightower

[57] ABSTRACT

An encapsulant (17) is applied to a semiconductor wafer (16). The bottom surface (28) of the wafer (16) is held substantially planar while curing the encapsulant (17). The bottom surface (28) is held against a substantially planar support plate (12) to facilitate holding the wafer (16) substantially planar. A polisher plate (18) is pressed against the encapsulant (17) to assist ensuring that the encapsulant has a substantially smooth surface and substantially uniform thickness.

20 Claims, 1 Drawing Sheet

SEMICONDUCTOR ENCAPSULATION METHOD

BACKGROUND OF THE INVENTION

The present invention relates, in general, to methods of producing semiconductor devices, and more particularly, to methods of encapsulating semiconductor devices.

Chip-scale packaging (CSP) is a term used by the semiconductor industry for a semiconductor packaging technique. One example of chip-scale packaging is described in a article by Don Richmond, "Micro SMT Integrated Circuit Technical White Paper", Micro SMT Inc., Jan. 25, 1993. Chip-scale packages generally are formed by applying an encapsulant to an active surface of a semiconductor wafer, then thinning the back side of the semiconductor wafer followed by separating individual semiconductor die by sawing, scribing, or laser cutting through the back side of the wafer. Electrical contacts are also formed on the back side of the wafer so that the back side of the wafer can be used for attaching the semiconductor device to an interconnect mechanism such as a printed wiring board.

One problem with chip-scale packaging is warping or deformation of the semiconductor wafer during the manufacturing process. Generally, the encapsulant is applied to the active surface of the entire wafer and subsequently cured to form a protective layer on the active surface of the wafer. During this process, the encapsulant shrinks thereby warping the underlying semiconductor wafer. This warpage prevents accurate mask alignments during metallization, and other subsequent semiconductor processing techniques on the warped wafer.

Additionally, the thickness of the encapsulant varies across the surface of the wafer and typically has an edge-bead along the outside edges of the wafer. The thickness often varies greater than ten microns and results in poor alignments in subsequent processing operations. Also, the surface of the encapsulant typically is very rough and has peaks and valleys in various locations of the encapsulant surface. The difference between such peaks and valleys usually are greater than five microns. The non-uniform thickness and rough surface both prevent accurate mask alignments during subsequent semiconductor processing steps on the wafer.

Accordingly, it is desirable to have a semiconductor encapsulation method that does not warp the semiconductor wafer, that results in a substantially uniform thickness of the encapsulation layer on the semiconductor wafer, and that results in a substantially smooth surface.

DETAILED DESCRIPTION OF THE DRAWINGS

Figure 1:
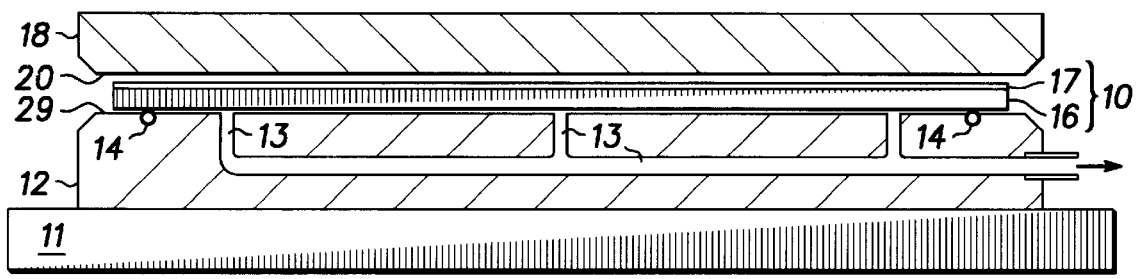
FIG. 1 is a cross-sectional view illustrating a stage in a semiconductor encapsulation method according to the present invention.

FIG. 1 illustrates a cross-sectional view of a stage in forming an encapsulated semiconductor device 10. Prior to the stage shown in FIG. 1, active semiconductor devices are formed in a top surface of a semiconductor wafer 16. Subsequently, an encapsulant 17 is applied to the top surface of wafer 16. Encapsulant 17 can be a variety of different materials including resins such as polyimide, siloxanes, epoxies, or combinations of such materials. Encapsulant 17 can be applied by stencil printing techniques or other techniques that are well known to those skilled in the semiconductor art. Encapsulant 17 should have a thickness sufficient to protect wafer 16 during subsequent semiconductor processing operations, and typically is between approximately twenty-five and two hundred microns.

After applying encapsulant 17, a bottom surface of wafer 16 is placed on a support plate 12 that is used for maintaining the bottom surface of wafer 16 substantially planar while curing encapsulant 17. Preferably, plate 12 limits warpage, that is, maximum variation across the bottom surface of wafer 16, on a four inch wafer to less than approximately one hundred fifty microns. Plate 12 has a substantially planar surface 29 that mates against the bottom surface of wafer 16. Plate 12 can be formed from a variety of materials that can be formed to have a surface that varies less than approximately 5 microns in order to form surface 29. Suitable materials for plate 12 include graphite, glass, and metals, such as stainless steel. Plate 12 has a plurality of vacuum ports 13 that are utilized to hold wafer 16 firmly against surface 29. Ports 13 are connected to an external vacuum source in order to provide a vacuum sufficient to hold wafer 16 substantially flat on surface 29. Typically, a vacuum less than approximately $1.03 \times 10^5$ newtons/meter$^2$ is sufficient. Additionally, plate 12 may have a seal 14, for example an O-ring, in surface 29 that assists forming the vacuum that holds wafer 16 firmly against surface 29.

After wafer 16 is firmly held against surface 29, a heat source is used to cure encapsulant 17. As shown in FIG. 1 a heat source 11, such as a hot plate, or other controlled heat source, is used for curing encapsulante 17. During the curing operation, a substantially planar surface 20 of a polisher plate 18 is pressed against encapsulant 17 in order to form a substantially smooth surface and a substantially uniform thickness across encapsulant 17. Typically, encapsulant 17 is partially cured prior to pressing plate 18 against encapsulant 17. Depending on the type of material used for encapsulant 17, the partial cure partially polymerizes the material of encapsulant 17 or volatizes a portion of the solvents therein. For example, when using an epoxy material the epoxy is cured to the gel point.

Surface 20 of plate 18 should have a surface roughness that results in encapsulant 17 having a surface roughness, measured by the excursion from peaks to valleys, of less than approximately five microns. The thickness variation of encapsulant 17 generally is less than approximately ten microns and preferably less than five microns. Plate 18 should press surface 20 against encapsulant 17 with a force sufficient to maintain the surface roughness and thickness variations. Typically, a force of approximately $1 \times 10^4$ newtons/meter$^2$ is sufficient and may result from the weight of plate 18 or from additional pressure from an external source, not shown.

After curing encapsulant 17, additional semiconductor operations are performed on the bottom surface of wafer 16. For example, wafer 16 can be thinned by removing portions of the bottom surface, and contacts can be formed to provide electrical connection to semiconductor devices formed on wafer 16.

Figure 2:
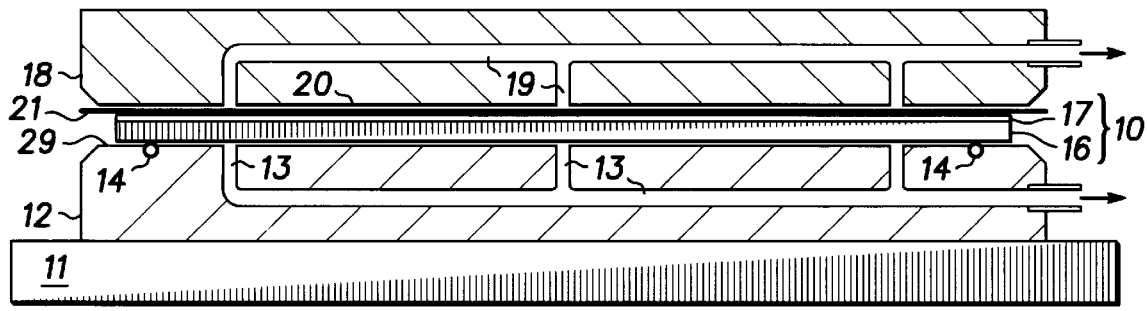
FIG. 2 is a cross-sectional view illustrating a different stage in a semiconductor encapsulation method according to the present invention.

FIG. 2 illustrates a cross-sectional view of an optional step in the formation of encapsulated semiconductor device 10 shown in FIG. 1. Elements of FIG. 2 that have the same reference numbers as FIG. 1 are the same as the corresponding FIG. 1 elements. A release film 21 is used between encapsulant 17 and surface 20 of plate 18. Film 21 is used to prevent encapsulant 17 from adhering to surface 20 thereby ensuring that a clean substantially planar surface is always used to press against encapsulant 17. Using film 21 eliminates the time required to clean surface 20 thereby reducing manufacturing costs and reducing cycle time. Typically, film 21 is replaced after curing the encapsulant on each wafer. Film 21 can be a variety of materials including plastics, metals, or polymers such as Teflon™, polyolefin and polyester. Film 21 is held against surface 20 so that film 21 has a substantially planar surface that is subsequently pressed against encapsulant 17. A plurality of vacuum ports 19 are formed in plate 18 and connected to an external vacuum source, not shown, in order to hold film 21 against surface 20.

Alternatively, a sacrificial layer can be applied to the surface of encapsulant 17. The sacrificial layer adheres to the surface of encapsulant 17 and can be applied during the curing of encapsulant 17. Alternately, the sacrificial layer can have an adhesive that adheres to encapsulant 17 after curing encapsulant 17. The sacrificial layer provides the smooth surface required for subsequent processing of wafer 16. After the processing is complete, the sacrificial layer can be removed. Although the removal may effect surface roughness, once semiconductor processing is complete the requirement for a smooth surface may no longer apply. The sacrificial layer can be a metal film, a plastic film, or a polymer film. Examples of suitable materials for the sacrificial layer include TEDLAR™ or Teflon™ by DuPont Inc., of Wilmington Del.

Figure 3:
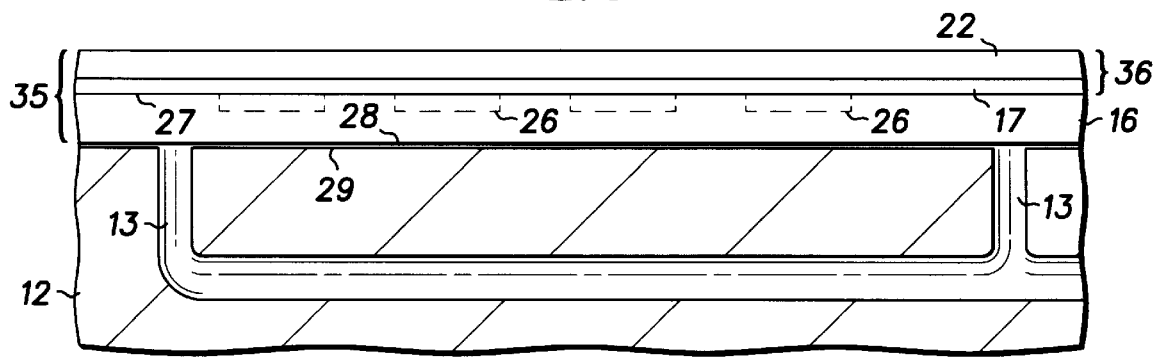
FIG. 3 illustrates a cross-sectional view of an encapsulated semiconductor device according to the present invention.

FIG. 3 illustrates an enlarged cross-sectional portion of an encapsulated semiconductor device 35. Elements of FIG. 3 that have the same reference numbers as FIG. 1 and FIG. 2 are the same as the corresponding FIG. 1 and FIG. 2 elements. As indicated hereinbefore, wafer 16 has semiconductor devices 26 formed on a top surface 27. A bottom surface 28 of wafer 16 is held substantially planar against surface 29 as described hereinbefore in the discussion of FIG. 1. Encapsulant 17 is applied to surface 27 as also explained in the discussion of FIG. 1.

Prior to curing or partially curing encapsulant 17, a laminate 22 is applied to the surface of encapsulant 17. Laminate 22 is utilized to provide further protection during subsequent processing of wafer 16, and increases the mechanical integrity of device 35. Also, laminate 22 forms a smooth surface on encapsulated semiconductor device 35 to facilitate subsequent processing. Laminate 22 can be a variety of materials and typically is a B-stage resin that is reinforced with a material or materials such as glass fibers, carbon fibers, paper, or metals. One example of a suitable material is BT resin manufactured by Nelco Laminates of Tempe Ariz.

Laminate 22 generally is applied while encapsulant 17 is still wet, that is, prior to partially or completely curing encapsulant 17, in order to prevent forming voids between laminate 22 and encapsulant 17. Alternately, encapsulant 17 can be partially cured, as described in the explanation of FIG. 1, prior to applying laminate 22. Laminate 22 typically is applied using a pair of rollers. Such application techniques are well known to those skilled in the art. Thereafter, plate 18 is used to press surface 20 against laminate 22 while curing laminate 22 and encapsulant 17 as described in the discussed in of FIG. 1. After curing, a portion of laminate 22 has polymerized with encapsulant 16 to form a composite layer 36.

Figure 4:
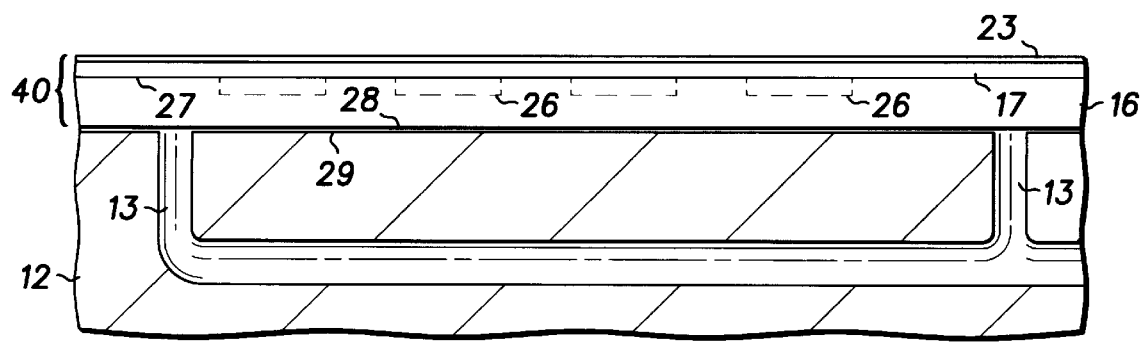
FIG. 4 illustrates a cross-sectional view of an alternate embodiment of an encapsulated semiconductor device according to the present invention.

FIG. 4 illustrates a cross-sectional view of an encapsulated semiconductor device 40 that is an alternate embodiment to the encapsulated semiconductor device discussed in FIGS. 1, 2, and 3. Elements of FIG. 4 that have the same reference numerals as FIGS. 1, 2, and 3 are the same as the corresponding FIGS. 1, 2, and 3 elements. After applying encapsulant 17 to wafer 16, plate 18 (FIG. 2) is utilized to press a metal film 23 against encapsulant 17 thereby pressing a substantially planar surface against encapsulant 17. Film 23 is held by plate 18 in a manner similar to that of film 21 described in FIG. 2. Thereafter, encapsulant 17 is cured while plate 18 presses film 23 against encapsulant 17 so that film 23 remains attached to encapsulant 17 after curing. Metal film 23 is used to protect underlying encapsulant 17 during subsequent semiconductor processing operations performed on surface 28 of wafer 16. Additionally, film 23 can be utilized for marking the semiconductor devices underlying film 23. The thickness of film 23 should be sufficient to prevent chemicals in subsequent processing steps from penetrating film 23. Generally, a thickness of two hundred to four hundred nanometers is sufficient. The material used for film 23 can be a variety of common semiconductor materials such as copper, aluminum, gold, or silver. After forming film 23, additional wafer processing operations can be performed on surface 28 of wafer 40 while film 23 protects the top surface of wafer 40. Additionally, film 23 can be applied to laminate 22 shown in FIG. 3.

By now it should be appreciated that there has been provided a novel method for encapsulating a semiconductor device. Holding the semiconductor wafers substantially flat while curing the encapsulant applied to the semiconductor wafer minimizes wafer warping and increases the yield and the usable area of a semiconductor wafer that utilizes an encapsulant. Consequently, subsequent mask alignments can be accurately performed on the encapsulated wafer. Pressing a substantially planar surface against the encapsulant while curing the encapsulant minimizes the thickness variations across the encapsulant and minimize roughness of the surface of the encapsulant thereby facilitating subsequent semiconductor processing operations. Applying a laminate prior to curing the encapsulant also eliminates warpage and surface roughness, thereby improving the accuracy of subsequent semiconductor processing operations.

We claim:

1. A semiconductor encapsulation method comprising:
   holding a semiconductor wafer against a first planar surface that has a surface variation of less than five microns; and
   pressing a second planar surface against an encapsulant that is on the semiconductor wafer while curing the encapsulant.

2. The method of claim 1 further including using a second planar surface having a surface roughness that results in a surface of the encapsulant having a maximum peak to valley excursion of less than five microns.

3. The method of claim 1 wherein pressing the second planar surface against the encapsulant includes pressing a release film against the encapsulant.

4. The method of claim 1 wherein pressing the second planar surface against the encapsulant includes pressing a metal film against the encapsulant wherein the metal becomes attached to the encapsulant.

5. The method of claim 1 further including applying a laminate to the encapsulant prior to pressing the second planar surface.

6. The method of claim 1 wherein holding the semiconductor wafer against the first planar surface includes using a vacuum for holding the semiconductor wafer.

7. A semiconductor encapsulation method comprising:

providing a semiconductor wafer having semiconductor devices formed on a top surface of the wafer, the semiconductor wafer having a bottom surface;

applying an encapsulant to the top surface of the semiconductor wafer;

maintaining the bottom surface of the semiconductor wafer planar while partially curing the encapsulant; and pressing a planar surface against the encapsulant while further curing the encapsulant.

8. The method of claim 7 wherein pressing the planar surface against the encapsulant includes pressing one of a stainless steel plate, a metal plate, glass plate, or a graphite plate against the encapsulant.

9. The method of claim 7 wherein pressing the planar surface against the encapsulant includes using a release film between the planar surface and the encapsulant.

10. The method of claim 9 wherein using the release film includes using one of a plastic film, a metal film, a polymer film, a polyolefin film, or a polyester film.

11. The method of claim 7 wherein pressing the planar surface against the encapsulant includes pressing the planar surface against a metal film that is against the encapsulant wherein the metal film remains attached to the encapsulant after curing the encapsulant.

12. The method of claim 11 wherein pressing the planar surface against the metal film includes using a metal film thickness that is sufficient to prevent penetration of chemicals used during subsequent processing steps.

13. The method of claim 7 wherein maintaining the bottom surface of the semiconductor wafer planar includes maintaining warpage of the bottom surface to less than 150 microns.

14. The method of claim 7 wherein maintaining the bottom surface of the semiconductor wafer planar includes using a vacuum for holding the bottom surface of the semiconductor wafer against the planar surface.

15. The method of claim 7 wherein pressing the planar surface against the encapsulant includes pressing the planar surface that has a surface roughness that results in a surface of the encapsulant having a maximum peak to valley excursion of less than five microns.

16. A semiconductor encapsulation method comprising:

providing a semiconductor wafer having a top surface and a bottom surface;

applying an encapsulant on the top surface of the semiconductor wafer; and applying a sacrificial film to the encapsulant by pressing the sacrificial film against the encapsulant.

17. The method of claim 16 wherein applying the sacrificial film includes applying the sacrificial film while curing the encapsulant.

18. The method of claim 16 wherein applying the sacrificial film includes applying the sacrificial film prior to curing the encapsulant.

19. A semiconductor encapsulation method comprising:

providing a semiconductor wafer having a top surface and a bottom surface;

applying an encapsulant to the top surface of the semiconductor wafer;

applying a laminate to the encapsulant while maintaining the bottom surface of the semiconductor wafer planar; and curing the encapsulant.

20. The method of claim 19 wherein applying the laminate includes applying a resin reinforced with one of fiberglass, paper, or metal.

* * * * *